(12) United States Patent
Dickey

(10) Patent No.: US 10,401,420 B2
(45) Date of Patent: Sep. 3, 2019

(54) VOLTAGE SUPPRESSOR TEST CIRCUIT AND METHOD OF TESTING A VOLTAGE SUPPRESSOR

(71) Applicant: HAMILTON SUNDSTRAND CORPORATION, Charlotte, NC (US)

(72) Inventor: John A. Dickey, Caledonia, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 32 days.

(21) Appl. No.: 15/836,619

(22) Filed: Dec. 8, 2017

(65) Prior Publication Data
US 2019/0178930 A1 Jun. 13, 2019

(51) Int. Cl.
G01R 31/26 (2014.01)
H02H 1/00 (2006.01)
H02H 9/00 (2006.01)

(52) U.S. Cl.
CPC ....... *G01R 31/2607* (2013.01); *H02H 1/0007* (2013.01); *H02H 9/005* (2013.01); *G01R 31/2632* (2013.01)

(58) Field of Classification Search
CPC ............ G01R 31/2607; G01R 31/2632; H02H 9/005; H02H 1/0007
USPC ........................................ 324/500, 503, 508
See application file for complete search history.

(56) References Cited

U.S. PATENT DOCUMENTS

| | | | |
|---|---|---|---|
| 4,075,549 A | 2/1978 | Woodward | |
| 8,203,815 B2 * | 6/2012 | Kilroy | H02H 3/202 361/111 |
| 8,598,899 B2 | 12/2013 | Hess | |
| 9,383,405 B2 * | 7/2016 | Hess | H02H 9/042 |
| 9,711,960 B2 * | 7/2017 | Milkie | H02H 3/22 |
| 2005/0231210 A1 | 10/2005 | Coffeen et al. | |
| 2012/0153963 A1 | 6/2012 | Tyler | |
| 2015/0061692 A1 | 3/2015 | Kostakis | |
| 2016/0322807 A1 | 11/2016 | Milkie | |
| 2017/0060150 A1 * | 3/2017 | Stefanski | G05D 23/27 |
| 2017/0155244 A1 | 6/2017 | Dickey et al. | |
| 2017/0163030 A1 | 6/2017 | Dickey | |

(Continued)

FOREIGN PATENT DOCUMENTS

CA 2918679 5/2015

OTHER PUBLICATIONS

European Patent Office, European Search Report dated Apr. 16, 2019 in Application No. 18211351.4.

(Continued)

*Primary Examiner* — Giovanni Astacio-Oquendo
(74) *Attorney, Agent, or Firm* — Snell & Wilmer LLP

(57) ABSTRACT

A system for testing a transient voltage suppressor (TVS) configured to be coupled between a bus and a first ground or line to discharge a voltage surge on the bus to the first ground or line includes a pulse source configured to generate an electrical pulse. The system further includes a transformer having a first side coupled to the pulse source and a second side configured to be coupled to the TVS and configured to transfer the electrical pulse to the TVS and to transfer an at least partial reflection of the electrical pulse from the TVS to the first side. The system also includes a test point coupled to the first side of the transformer and configured to receive the at least partial reflection of the electrical pulse.

18 Claims, 4 Drawing Sheets

(56) References Cited

U.S. PATENT DOCUMENTS

2018/0036740 A1* 2/2018 Nelson .................. B02C 19/18
2018/0059176 A1* 3/2018 Ding .................... G01R 1/0433

OTHER PUBLICATIONS

Finis G., et al, "Laboratory for the qualification-testing of spds combining highest power performance parameters with unique fine adjustment possibilities", 2014 International Conference on Lightning Protection (ICLP), IEEE, Oct. 11, 2014 (Oct. 11, 2014), pp. 340-345.

* cited by examiner

VOLTAGE SUPPRESSOR TEST CIRCUIT AND METHOD OF TESTING A VOLTAGE SUPPRESSOR

FIELD

The present disclosure is directed to systems and methods for determining an operational status of a voltage suppressor.

BACKGROUND

Various types of voltage suppressors may be used in circuits in order to reduce the likelihood of damage to sensitive electronics resulting from power surges. Transient voltage suppressors (TVSs) may be capable of suppressing transient power surges, such as those due to lightning strikes.

Vehicles, such as Aircraft, may include multiple electronic systems, each having sensitive electronic devices. Some of the systems may have an exposed bus which may be susceptible to lightning strikes or other sources of transient power surges. In that regard, many aircraft include TVSs to protect against such lightning strikes. As a power surge is received on the bus, the TVS may shunt the power surge to a ground, thus reducing the likelihood of the power surge reaching and damaging the electronic devices.

The operation of a TVS may degrade over time or due to exposure to power surges. As these TVSs degrade, they may begin to function improperly, for example, by reduced shunting of the power surge to ground. In that regard, TVSs may be periodically removed from their corresponding system and connected to a test bench to ensure proper operation. However, such benchtop testing may be relatively expensive and may result in grounding of the aircraft during testing.

SUMMARY

Described herein is a system for testing a transient voltage suppressor (TVS) configured to be coupled between a bus and a first ground or line to discharge a voltage surge on the bus to the first ground or line. The system includes a pulse source configured to generate an electrical pulse. The system further includes a transformer having a first side coupled to the pulse source and a second side configured to be coupled to the TVS and configured to transfer the electrical pulse to the TVS and to transfer an at least partial reflection of the electrical pulse from the TVS to the first side. The system also includes a test point coupled to the first side of the transformer and configured to receive the at least partial reflection of the electrical pulse.

Any of the foregoing embodiments may also include a controller coupled to the test point and configured to compare the at least partial reflection of the electrical pulse to a threshold value to determine the status of the TVS.

In any of the foregoing embodiments, the first side of the transformer has a first side first terminal coupled to the pulse source and a first side second terminal coupled to the test point, and the second side of the transformer has a second side first terminal configured to be coupled to the TVS and a second side second terminal coupled to a second ground or line.

Any of the foregoing embodiments may also include a diode coupled to the second side first terminal of the transformer and configured to be coupled between the second side first terminal and the bus to reduce a likelihood of the electrical pulse reaching the bus.

Any of the foregoing embodiments may also include a first capacitor electrically coupled between the pulse source and the first side first terminal of the transformer, and a second capacitor configured to be electrically coupled between the TVS and the second side first terminal.

Any of the foregoing embodiments may also include a third capacitor and a resistor connected together in parallel and coupled between the first side second terminal of the transformer and the second ground or line.

In any of the foregoing embodiments, the pulse source includes a pulse generator configured to generate a control pulse and a transistor coupled to the pulse generator and configured to transmit voltage from a power source to the first side of the transformer in response to receiving the control pulse.

In any of the foregoing embodiments, the system is configured for use with a vehicle, and the system is configured to test the TVS during operating of the vehicle.

Also disclosed is a system for testing a status of a transient voltage suppressor (TVS) configured to be coupled between a bus and a first ground or line to discharge a voltage surge on the bus to the first ground or line. The system includes a pulse source configured to generate an electrical pulse. The system also includes a transformer having a first side coupled to the pulse source and a second side configured to be coupled to the TVS and to transfer the electrical pulse to the TVS and to transfer an at least partial reflection of the electrical pulse from the TVS to the first side, the TVS configured to be coupled between the second side of the transformer and the first ground or line. The system also includes a test point coupled to the first side of the transformer and configured to receive the at least partial reflection of the electrical pulse.

Any of the foregoing embodiments may also include a controller coupled to the test point and configured to compare the at least partial reflection of the electrical pulse to a threshold value to determine the status of the TVS.

In any of the foregoing embodiments, the first side of the transformer has a first side first terminal coupled to the pulse source and a first side second terminal coupled to the test point, and the second side of the transformer has a second side first terminal configured to be coupled to the TVS and a second side second terminal coupled to the first ground or line.

Any of the foregoing embodiments may also include a diode coupled to the second side first terminal of the transformer and configured to be coupled between the second side first terminal and the bus to reduce a likelihood of the electrical pulse reaching the bus.

Any of the foregoing embodiments may also include a first capacitor electrically coupled between the pulse source and the first side first terminal of the transformer, and a second capacitor electrically coupled between the TVS and the second side first terminal.

Any of the foregoing embodiments may also include a third capacitor and a resistor connected together in parallel and coupled between the first side second terminal of the transformer and a second ground or line.

In any of the foregoing embodiments, the pulse source includes a pulse generator configured to generate a control pulse and a transistor coupled to the pulse generator and configured to transmit voltage from a power source to the first side of the transformer in response to receiving the control pulse.

Also disclosed is a method of testing a status of a transient voltage suppressor (TVS). The method includes generating, by a pulse source, an electrical pulse. The method also includes transmitting, from a first side of a transformer to a second side of the transformer, the electrical pulse to the TVS. The method also includes receiving, at a test point coupled to the first side of the transformer, an at least partial reflection of the electrical pulse. The method also includes determining, by a controller, the status of the TVS by comparing the at least partial Any of the foregoing embodiments may also include outputting, by an output device, the status of the TVS.

Any of the foregoing embodiments may also include blocking, by a diode coupled between the second side of the transformer and a bus, the electrical pulse to reduce a likelihood of the electrical pulse reaching the bus.

In any of the foregoing embodiments, comparing the at least partial reflection of the electrical pulse to the threshold value includes at least one of comparing a voltage of the at least partial reflection of the electrical pulse to a threshold voltage, comparing samples of the at least partial reflection of the electrical pulse to a threshold waveform, or comparing an integral of the samples of the at least partial reflection of the electrical pulse to a threshold integral value.

In any of the foregoing embodiments, determining, by the controller, the status of the TVS further includes determining the status of the TVS while a vehicle with which the TVS is used is in operation.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
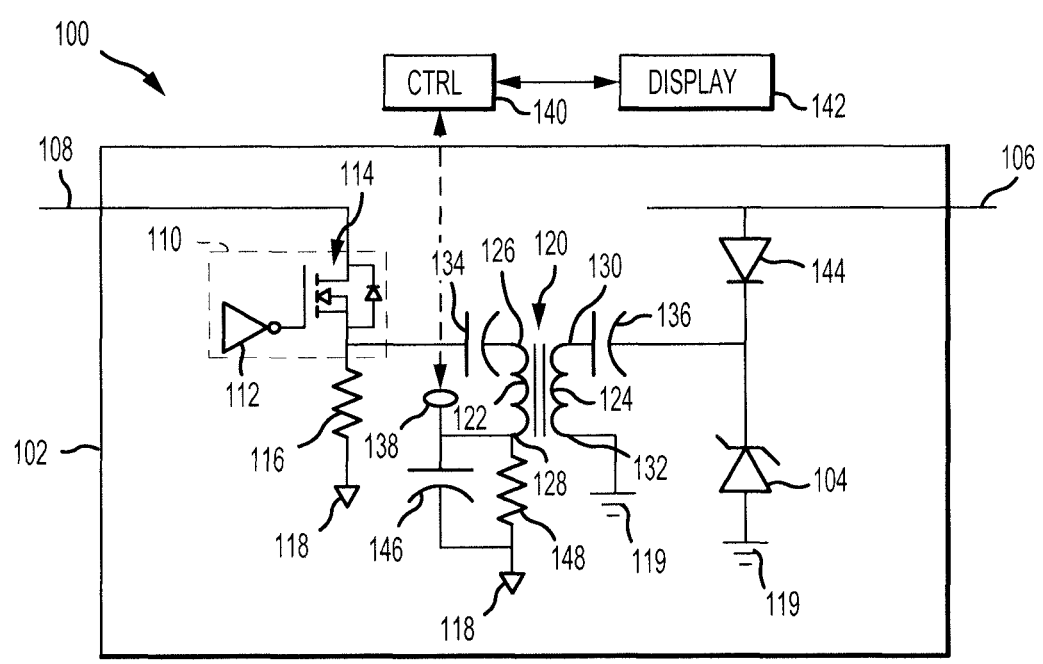
FIG. 1 is a block diagram including a circuit diagram and illustrating a system for determining a status of a transient voltage suppressor (TVS), in accordance with various embodiments of the present disclosure.

Referring to FIG. 1, a system 100 for testing a status of a voltage suppressor, such as a transient voltage suppressor (TVS) 104, is shown. The system 100 includes a circuit 102 having various components coupled together for testing the status of the TVS 104 along with a controller 140 and a display 142. In various embodiments, the circuit 102 may be located on a single card, such as a single printed circuit board (PCB), or may be located on multiple cards or substrates. In various embodiments, the system 100 may be configured for use with a vehicle, such as an aircraft, and may be designed to test the status of the TVS 104 during operation of the vehicle.

The TVS 104 may include one or more device or devices that are designed to react to sudden or momentary overvoltage conditions (i.e., transient power surges). For example, the TVS 104 may include a transient voltage suppression diode, a metal oxide varistor (MOV), an avalanche or other diode, a gas discharge tube, or the like.

The TVS 104 may be coupled between a bus 106 and a first ground or line 119. The first ground or line 119 may be a ground or another power or signal line. For example, the first ground or line may be another power bus, or may be a load bus coupled across a solid state power controller. The bus 106 may be connected to sensitive electronics. In that regard, it is desirable for an overvoltage condition (i.e., a surge) present on the bus 106 to be discharged to the first ground or line 119 in order to reduce the likelihood of damage to the sensitive electronics connected to the bus 106. When operating properly, the TVS 104 performs such discharge, or shunting, of an overvoltage condition from the bus 106 to the first ground or line 119. However, if the TVS 104 becomes damaged, it may fail to discharge some or all of the overvoltage condition. Accordingly, it is desirable to monitor the status of the TVS 104 to verify whether the TVS 104 is operating properly.

The circuit 102 may include various components designed to test the status of the TVS 104. In particular, the circuit 102 may include a pulse source 110. The pulse source 110 may include any electronic device capable of generating an electrical pulse. The electrical pulse may include a voltage signal having a relatively short duration and having a square shape, a rounded shape, or the like. The pulse source 110 may include, for example, a pulse generator 112. The pulse generator 112 may generate a control pulse which may have a relatively low amplitude. In various embodiments, the pulse generator 112 may function as the pulse source 110 alone and may generate an electrical pulse having a relatively great amplitude.

In various embodiments, the pulse source 110 may include the pulse generator 112 and a transistor 114. The transistor 114 may be connected at least one of between a power source 108 and the second ground or line 118, or between the power source 198 and a first capacitor 134. The second ground or line 118 may be the same ground or line as the first ground or line 119, may be another ground, or may be another signal or power line. During normal operation, the transistor 114 may act as an open circuit between the power source 108 and the second ground or line 118. However, in response to receiving the control pulse from the pulse generator 112, the transistor 114 may operate to close the circuit between the power source 108 and the first capacitor 134 such that the transistor 114 outputs the electrical pulse through the first capacitor 134 having a similar duration as the control pulse and a greater amplitude than the control pulse.

The circuit 102 may further include a pulse resistor 116. The pulse resistor 116 may be coupled between the output of the transistor 114 and the second ground or line 118. The pulse resistor 116 may drain accumulated charge on the first capacitor 134 in response to the transistor 114 turning off.

The circuit 102 may also include a transformer 120. The transformer 120 may have a first side 122 which may include a first inductor, coil, or winding, and a second side 124 which may include a second inductor, coil, or winding. The first side 122 of the transformer 120 may include a first side first terminal 126 and a first side second terminal 128. The second side 124 of the transformer 120 may include a second side first terminal 130 and a second side second terminal 132.

The values of the electrical pulse generated by the pulse source 110 and the transformer 120 may vary. However, it may be desirable for the output of the electrical pulse at the second side 124 of the transformer 120 to have a pulse amplitude that is greater than the normal operating voltage of the TVS 104. Thus, the values of the pulse source 110 and the transformer 120 may be selected to satisfy such limitation.

The circuit 102 may include a first capacitor 134 connected between the output of the transistor 114 and the first side first terminal 126 of the transformer 120. The circuit 102 may further include a second capacitor 136 connected between the second side first terminal 130 of the transformer 120 and an input side of the TVS 104.

The electrical pulse generated by the pulse source 110 may travel through the first capacitor 134 to the first side first terminal 126 of the first side 122 of the transformer 120, may travel through the transformer 120 to the second side first terminal 130 of the second side 124, and may travel through the second capacitor 136 due to the relatively short duration of the electrical pulse.

The circuit 102 may include a diode 144 coupled between the second capacitor 136 and the bus 106. The diode 144 may be connected in such a way as to reduce the likelihood of the electrical pulse reaching the bus 106, and thus sensitive electronics coupled to the bus 106.

The leading edge of the electrical pulse corresponds to a relatively high change in voltage per unit of time at the second side 124 of the transformer 120. This relatively high change in voltage per unit of time may result in a sharp rising exponential pulse. If the TVS 104 is functioning properly, current flows through the TVS 104 as a result of the electrical pulse, creating current through the second side 124 of the transformer 120. When the current flows through the second side 124 of the transformer 120, it causes current to flow through the first side of the transformer. This current through the first side of the transformer may be referred to as a partial reflection of the electrical pulse from the TVS 104.

A test point 138 may be coupled to the first side second terminal 128 of the transformer 120 and may receive the reflection of the electrical pulse from the TVS 104. The controller 140 may be coupled to the test point 138 and may receive the reflection of the electrical pulse. The controller 140 may analyze the reflection of the electrical pulse to identify whether the TVS 104 is functioning properly.

The controller 140 may include one or more of a central processing unit (CPU), an accelerated processing unit (APU), a digital signal processor (DSP), a field programmable gate array (FPGA), an application specific integrated circuit (ASIC), a voltage comparator, or the like.

The controller 140 may transmit a signal to the display 142 indicating the status of the TVS 104 (i.e., indicating whether the TVS 104 is functioning properly). In various embodiments, the controller 140 may identify whether the TVS 104 is functioning as a short circuit or an open circuit (rather than operating properly), and may transmit this information to the display 142. The display 142 may then output the status of the TVS 104.

The display 142 may include any display or output device, such as a display, a speaker, a touchscreen, or the like. In some embodiments, the display 142 may include any device or system capable of outputting or reporting a fault to a user or another component or system. Stated differently, the display 142 may include any system or component capable of informing a user or another system of the status of the TVS 104.

The circuit 102 may further include a third capacitor 146 and a resistor 148 connected in parallel between the first side second terminal 128 and the second ground or line 118. The third capacitor 146 may provide a path for the electrical pulse, or the reflection of the electrical pulse, to the second ground or line 118. After the discharge of the pulse or the reflection of the pulse to the second ground or line 118 via the third capacitor 146, the third capacitor 146 may remain charged. In that regard, the resistor 148 may provide a path for the remaining charge on the third capacitor 146 to flow to the second ground or line 118. It may be important for the time constant of the third capacitor 146 and the resistor 148 to be sufficiently long to facilitate detection and evaluation of the reflected pulse.

Figure 2:
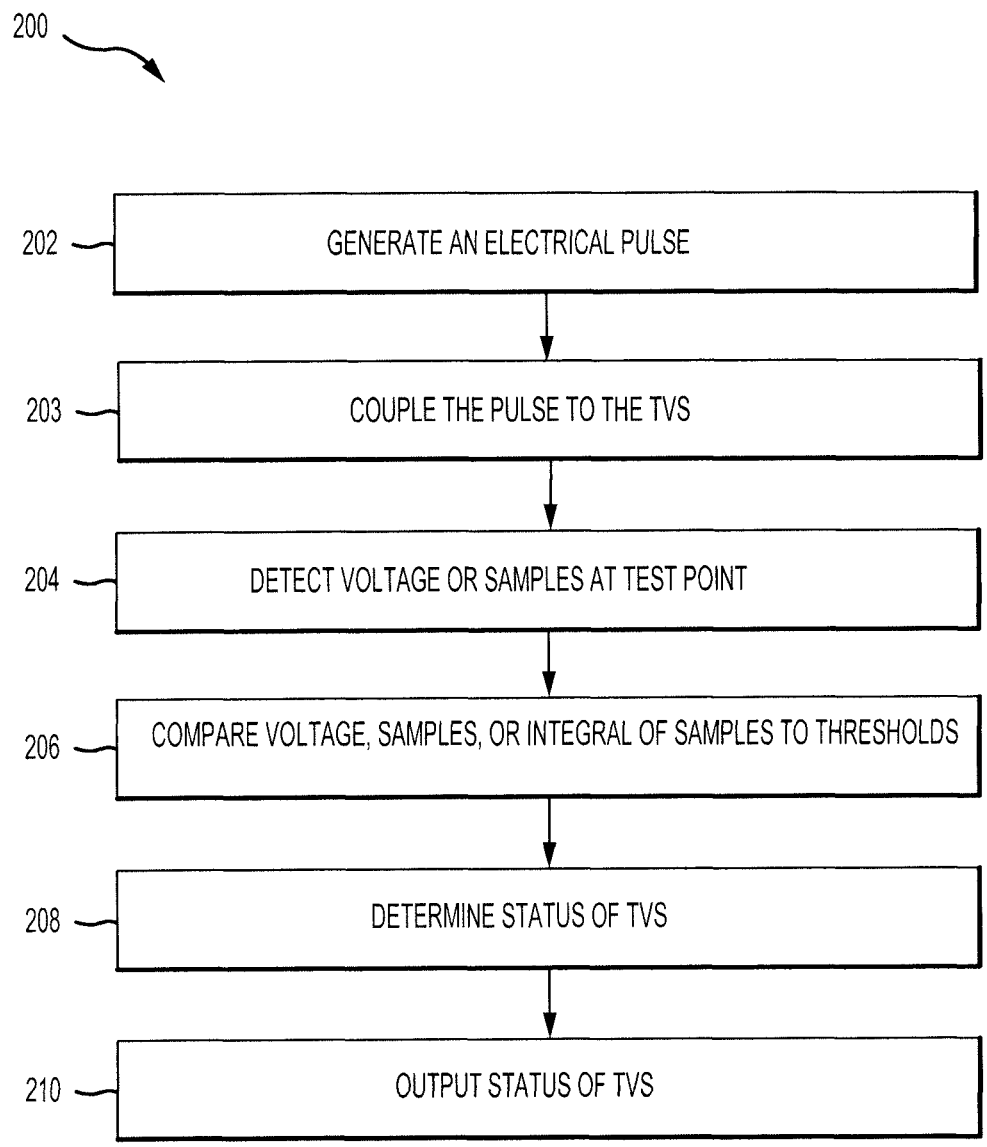
FIG. 2 is a flowchart illustrating a method for determining a status of a TVS, in accordance with various embodiments of the present disclosure.

Referring now to FIG. 2, a method 200 for testing a status of the voltage suppressor, such as the TVS 104 of FIG. 1, is shown. In block 202, a pulse source may generate an electrical pulse. The pulse may transfer through a circuit, such as the circuit 102 of FIG. 1, until it reaches a TVS. The TVS may cause a reflection of the electrical pulse which may then travel back through a portion of the circuit to a test point.

In block 203, the pulse may be coupled to the TVS. For example, the pulse may be coupled to the TVS via a transformer.

In block 204, one or more voltage measurement or samples may be detected at the test point. For example, a controller coupled to the test point may receive the reflection of the electrical pulse and may measure or calculate one or more voltage measurements or samples.

In block 206, the controller may compare the one or more voltage measurements, samples, or an integral of the samples to one or more threshold values. In block 208, the controller may determine a status of the TVS based on the comparison.

In block 210, the controller may output the status of the TVS that was determined based on the comparison.

Figure 3:
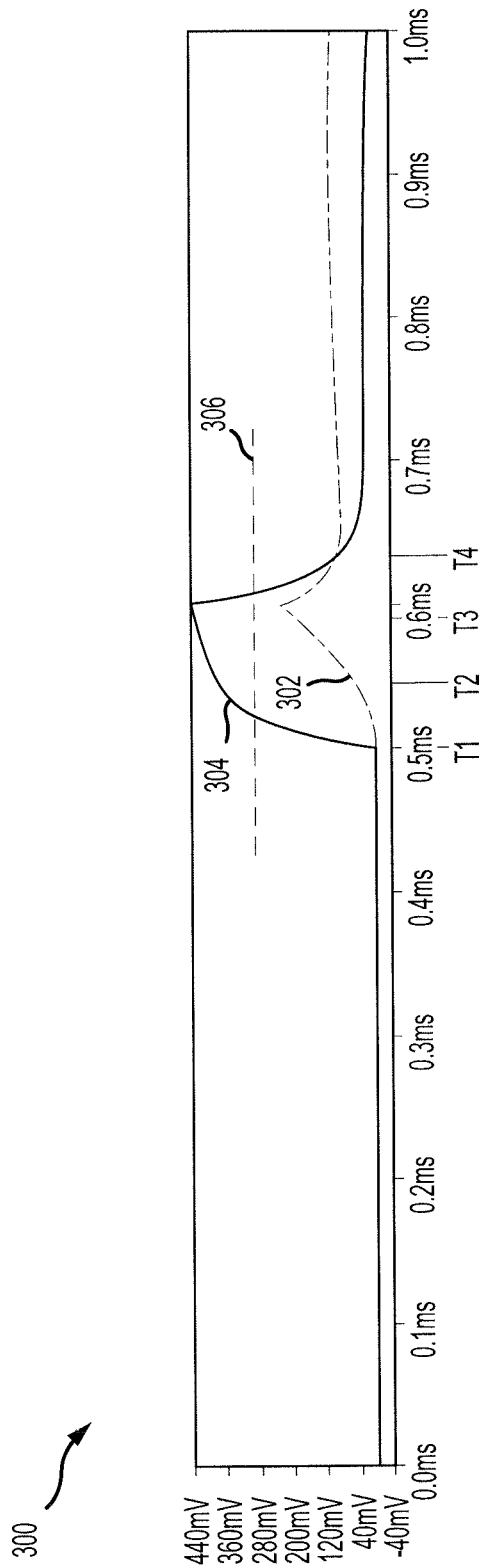
FIG. 3 is a graph illustrating results of tests using the method of FIG. 2 on a model of the system of FIG. 1 having a properly functioning TVS and a partially closed TVS, in accordance with various embodiments of the present disclosure.

Referring now to FIGS. 1 and 3, a graph 300 illustrates exemplary output of two tests using a model of the circuit 102. In particular, a first line 302 illustrates a detected signal at the test point 138 of a test using a properly functioning TVS, and a second line 304 illustrates a detected signal at the test point 138 of a test using a partially shorted TVS.

Specific values for the components of the circuit 102 used in the model will be described, however, one skilled in the art will realize that many different ranges and combinations of values may be used without departing from the scope of the disclosure. In the model, the first capacitor 134 was provided with a value of 1 microfarad (μF) and the second capacitor 136 was provided with a value of 10 μF. The third capacitor 146 was provided with a value of 100 μf, and the resistor 148 was provided with a value of 1 Kilo ohm (1 KΩ). The first capacitor 134, the second capacitor 136, and the third capacitor 146 may have, for example, values between 1 nanofarad (nF) and 1 Farad (F), between 100 nF and 100 millifarad (mF), or between 500 nF and 1 mF. The resistor 148 may have, for example, values between 1 ohm and 100 megaohms, between 10 ohms and 10 megaohms, between 100 ohms and one megaohm, or the like. The transformer 120 was selected to be a 1-to-1 transformer and the coil on each side was selected to have a value of 10 millihenry (mH). The transformer 120 may be, for example, between a 1-to-1 transformer and a 100-to-1 transformer, between a 1-to-1 transformer and a 50-to-1 transformer, or between a 1-to-1 transformer and a 10-to-1 transformer. The coils on each side may have, for example, values between 1 nanohenry (nH) and 1 Henry, between 100 nH and 500 mH, or between 500 nH and 100 mH.

As shown in the graph 300, the reflected waveform detected using the properly functioning TVS grows in amplitude more slowly than the reflected waveform detected using the partially shorted TVS. Furthermore, the reflected waveform detected using the partially shorted TVS reaches a greater amplitude than the reflected waveform detected using the properly functioning TVS.

A threshold voltage level 306 may be set between the first line 302 and the second line 304. The controller 140 may compare the voltage at the test point 138 to the threshold voltage level 306. If the measured voltage at the test point 138 is less than or equal to the threshold voltage level 306 then the controller 140 may determine that the TVS 104 is functioning properly. If the measured voltage at the test point 138 is greater than or equal to the threshold voltage level 306 then the controller 140 may determine that the TVS 104 is operating improperly. In various embodiments, this comparison may be performed by a voltage comparator, which may also be referred to as a controller.

In various embodiments, the controller 140 may take samples of the voltage at the test point 138 at specific time intervals, such as at times T1, T2, T3, and T4. The controller 140 may compare the samples at each of the time intervals to the threshold voltage level 306. In various embodiments, the controller 140 may compare the voltage at the time intervals to a threshold voltage waveform to identify whether at least one of the amplitude or the shape of the samples corresponds to the output of a properly functioning TVS. If the amplitude of the samples is equal to or less than the threshold voltage waveform then the controller 140 may determine that the TVS 104 is functioning properly. Otherwise the controller 140 may determine that the TVS 104 is functioning improperly. Similarly, if the shape of the samples is similar to the threshold voltage waveform then the controller 140 may determine that the TVS 104 is functioning properly. Otherwise the controller 140 may determine that the TVS 104 is functioning improperly.

In various embodiments, the controller 140 may integrate the value below the samples, or may interpolate a waveform between the samples and may integrate the value below the waveform. The controller may then compare the integral value to a threshold integral value to identify whether the integral value is equal to or less than the threshold value (which corresponds to proper functioning of the TVS 104) or whether the integral value is greater than the threshold value (which corresponds to improper functioning of the TVS 104).

Figure 4:
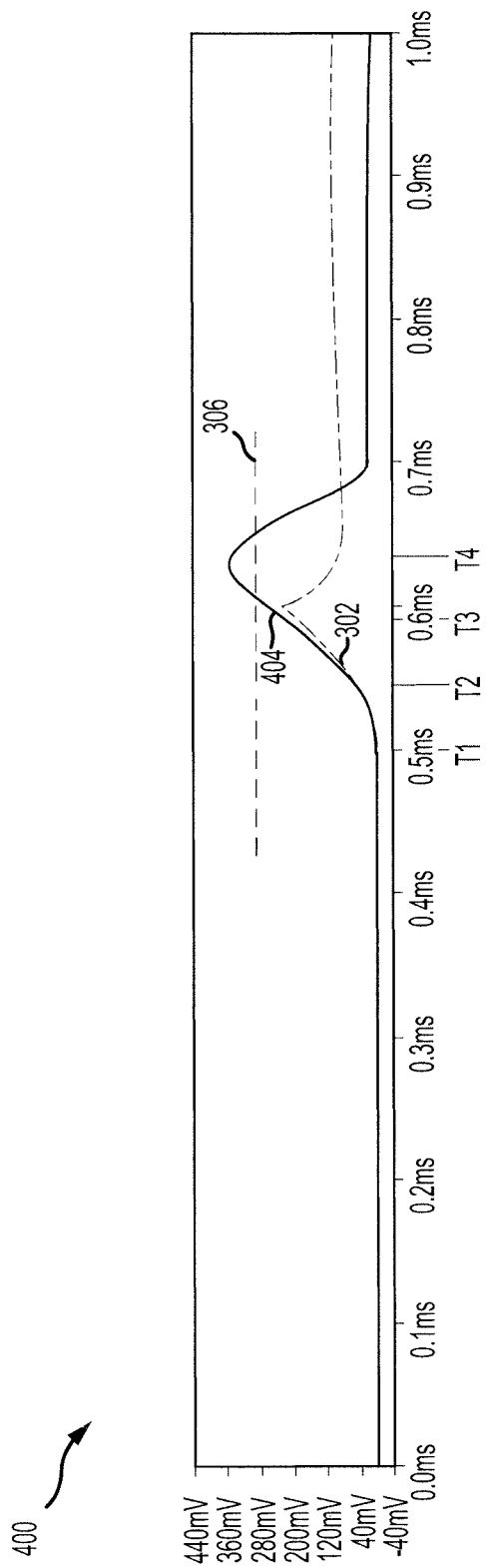
FIG. 4 is a graph illustrating results of tests using the method of FIG. 2 on a model of the system of FIG. 1 having a properly functioning TVS and a partially open TVS, in accordance with various embodiments of the present disclosure.

Referring now to FIGS. 1 and 4, a graph 400 illustrates the first line 302 that corresponds to the properly functioning TVS, and a second line 404 that illustrates a detected signal at the test point 138 of a test using a partially open TVS.

As shown, the reflected waveform detected using the partially open TVS reaches a greater amplitude than the reflected waveform detected using the properly functioning TVS. The reflected waveform detected using the partially open TVS also retains the greater amplitude for a longer period of time than the properly functioning TVS. In that regard, a controller or operator may determine that the TVS is partially open because the reflected waveform exceeds the threshold voltage level 306, by determining that the reflected wavelength has a significant amplitude for a predetermined period of time (such as 0.2 seconds), or a combination thereof.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for testing a transient voltage suppressor (TVS) configured to be coupled between a bus and a first ground or line to discharge a voltage surge on the bus to the first ground or line, the system comprising:
    a pulse source configured to generate an electrical pulse;
    a transformer having a first side coupled to the pulse source and a second side configured to be coupled to the TVS and configured to transfer the electrical pulse to the TVS and to transfer an at least partial reflection of the electrical pulse from the TVS to the first side; and
    a test point coupled to the first side of the transformer and configured to receive the at least partial reflection of the electrical pulse,
    wherein the first side of the transformer has a first side first terminal coupled to the pulse source and a first side second terminal coupled to the test point, and the second side of the transformer has a second side first terminal configured to be coupled to the TVS and a second side second terminal coupled to a second ground or line.

2. The system of claim 1, further comprising a controller coupled to the test point and configured to compare the at least partial reflection of the electrical pulse to a threshold value to determine the status of the TVS.

3. The system of claim 1, further comprising a diode coupled to the second side first terminal of the transformer and configured to be coupled between the second side first terminal and the bus to reduce a likelihood of the electrical pulse reaching the bus.

4. The system of claim 1, further comprising a first capacitor electrically coupled between the pulse source and the first side first terminal of the transformer, and a second capacitor configured to be electrically coupled between the TVS and the second side first terminal.

5. The system of claim 1, further comprising a third capacitor and a resistor connected together in parallel and coupled between the first side second terminal of the transformer and the second ground or line.

6. The system of claim 1, wherein the pulse source includes a pulse generator configured to generate a control pulse and a transistor coupled to the pulse generator and configured to transmit voltage from a power source to the first side of the transformer in response to receiving the control pulse.

7. The system of claim 1, wherein the system is configured for use with a vehicle, and the system is configured to test the TVS during operating of the vehicle.

8. A system for testing a status of a transient voltage suppressor (TVS) configured to be coupled between a bus and a first ground or line to discharge a voltage surge on the bus to the first ground or line, the system comprising:
    a pulse source configured to generate an electrical pulse;
    a transformer having a first side coupled to the pulse source and a second side configured to be coupled to the TVS and to transfer the electrical pulse to the TVS and to transfer an at least partial reflection of the electrical pulse from the TVS to the first side, the TVS configured to be coupled between the second side of the transformer and the first ground or line; and
    a test point coupled to the first side of the transformer and configured to receive the at least partial reflection of the electrical pulse,
    wherein the first side of the transformer has a first side first terminal coupled to the pulse source and a first side second terminal coupled to the test point, and the second side of the transformer has a second side first terminal configured to be coupled to the TVS and a second side second terminal coupled to the first ground or line.

9. The system of claim 8, further comprising a controller coupled to the test point and configured to compare the at least partial reflection of the electrical pulse to a threshold value to determine the status of the TVS.

10. The system of claim 8, further comprising a diode coupled to the second side first terminal of the transformer and configured to be coupled between the second side first terminal and the bus to reduce a likelihood of the electrical pulse reaching the bus.

11. The system of claim 8, further comprising a first capacitor electrically coupled between the pulse source and the first side first terminal of the transformer, and a second capacitor electrically coupled between the TVS and the second side first terminal.

12. The system of claim 8, further comprising a third capacitor and a resistor connected together in parallel and coupled between the first side second terminal of the transformer and a second ground or line.

13. The system of claim 8, wherein the pulse source includes a pulse generator configured to generate a control pulse and a transistor coupled to the pulse generator and configured to transmit voltage from a power source to the first side of the transformer in response to receiving the control pulse.

14. A method of testing a status of a transient voltage suppressor (TVS), comprising:
    generating, by a pulse source, an electrical pulse;
    transmitting, from a first side of a transformer having a first side first terminal coupled to the pulse source and a first side second terminal coupled to a test point to a second side of the transformer having a second side first terminal coupled to the TVS and a second side second terminal coupled to a second ground or line, the electrical pulse to the TVS;
    receiving, at the test point, an at least partial reflection of the electrical pulse; and
    determining, by a controller, the status of the TVS by comparing the at least partial reflection of the electrical pulse to a threshold value.

15. The method of claim 14, further comprising outputting, by an output device, the status of the TVS.

16. The method of claim 14, further comprising blocking, by a diode coupled between the second side of the transformer and a bus, the electrical pulse to reduce a likelihood of the electrical pulse reaching the bus.

17. The method of claim 14, wherein comparing the at least partial reflection of the electrical pulse to the threshold value includes at least one of comparing a voltage of the at least partial reflection of the electrical pulse to a threshold voltage, comparing samples of the at least partial reflection of the electrical pulse to a threshold waveform, or comparing an integral of the samples of the at least partial reflection of the electrical pulse to a threshold integral value.

18. The method of claim 14, wherein determining, by the controller, the status of the TVS further includes determining the status of the TVS while a vehicle with which the TVS is used is in operation.

* * * * *